United States Patent
Liang et al.

(10) Patent No.: US 12,414,420 B2
(45) Date of Patent: Sep. 9, 2025

(54) LIGHT EMITTING DEVICE AND LIGHT EMITTING APPARATUS

(71) Applicant: BOE Technology Group Co., Ltd., Beijing (CN)

(72) Inventors: Xuan Liang, Beijing (CN); Fei Wang, Beijing (CN); Mingxing Wang, Beijing (CN); Can Wang, Beijing (CN); Xue Dong, Beijing (CN); Qi Qi, Beijing (CN); Mingkun Yang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/016,681

(22) PCT Filed: Feb. 25, 2022

(86) PCT No.: PCT/CN2022/078077
§ 371 (c)(1),
(2) Date: Jan. 18, 2023

(87) PCT Pub. No.: WO2023/159514
PCT Pub. Date: Aug. 31, 2023

(65) Prior Publication Data
US 2024/0243239 A1 Jul. 18, 2024

(51) Int. Cl.
*H10H 20/857* (2025.01)
*H10H 20/01* (2025.01)
(Continued)

(52) U.S. Cl.
CPC ........ *H10H 20/857* (2025.01); *H10H 20/812* (2025.01); *H10H 20/824* (2025.01); *H10H 20/825* (2025.01); *H10H 20/855* (2025.01); *H10H 29/10* (2025.01); *H10H 20/0364* (2025.01)

(58) Field of Classification Search
CPC .. H10H 20/857; H10H 20/855; H10H 20/825; H10H 20/824; H10H 29/10; H10H 20/812; H10H 20/0364
See application file for complete search history.

(56) References Cited

U.S. PATENT DOCUMENTS 9,252,332 B1 * 2/2016 Kuo ............... H10H 20/84
2011/0121287 A1 * 5/2011 Yao ............... H10H 20/018
257/E33.024

(Continued)

FOREIGN PATENT DOCUMENTS

| CN | 103681996 A | 3/2014 |
|---|---|---|
| CN | 103840055 A | 6/2014 |
| WO | 2021148895 A1 | 7/2021 |

*Primary Examiner* — Richard A Booth
(74) *Attorney, Agent, or Firm* — Ling Wu; Stephen Yang; Ling and Yang Intellectual Property (57) ABSTRACT

A light emitting device and a light emitting apparatus are provided. The light emitting device includes at least two epitaxial structures provided in a first direction and connected in series, wherein two current diffusion layers and a transparent adhesive layer are provided between two adjacent epitaxial structures, a current diffusion layer is provided at one side of each of the two adjacent epitaxial structures, the transparent adhesive layer is provided between the two current diffusion layers, and metal nanoparticles are provided in the transparent adhesive layer.

20 Claims, 6 Drawing Sheets (51) Int. Cl.
*H10H 20/812* (2025.01)
*H10H 20/824* (2025.01)
*H10H 20/825* (2025.01)
*H10H 20/855* (2025.01)
*H10H 29/10* (2025.01)

(56) References Cited

U.S. PATENT DOCUMENTS

2011/0204376 A1 8/2011 Su et al.
2015/0146426 A1 5/2015 Yeh

* cited by examiner

LIGHT EMITTING DEVICE AND LIGHT EMITTING APPARATUS

CROSS-REFERENCE TO RELATED APPLICATION

The present application is a U.S. National Phase Entry of International Application PCT/CN2022/078077 having an international filing date of Feb. 25, 2022, and the contents disclosed in the above-mentioned application are hereby incorporated as a part of this application.

TECHNICAL FIELD

Embodiments of the present disclosure relate to, but are not limited to, the field of display technologies, and in particular to a light emitting device and a light emitting apparatus.

BACKGROUND

High-voltage light-emitting diode is a kind of current-type light-emitting element, and its driving current is far less than that of a conventional light-emitting diode, therefore, the power consumption of high-voltage light-emitting diode with same output power is far less than that of the conventional light-emitting diode. In addition, high-voltage light-emitting diode can greatly reduce the loss of AC/DC conversion efficiency.

SUMMARY

The following is a summary of subject matter described herein in detail. The summary is not intended to limit the protection scope of the present application.

An embodiment of the present disclosure provides a light emitting device, including at least two epitaxial structures provided in a first direction and connected in series, wherein two current diffusion layers and a transparent adhesive layer are provided between two adjacent epitaxial structures, a current diffusion layer is provided at one side of each of the two adjacent epitaxial structures, the transparent adhesive layer is provided between the two current diffusion layers, and metal nanoparticles are provided in the transparent adhesive layer, wherein each epitaxial structure includes an N-type semiconductor layer, a multi-quantum well layer and a P-type semiconductor layer which are sequentially stacked along the first direction.

In an exemplary embodiment, a material of the metal nanoparticles may include any one or more of nickel, silver, gold and the like.

In an exemplary embodiment, a diameter of the metal nanoparticles may be 5 nm to 100 nm.

In an exemplary embodiment, the metal nanoparticles may be distributed as a single layer of particles in the transparent adhesive layer.

In an exemplary embodiment, a total volume of the metal nanoparticles may be 10% to 60% of a volume of the transparent adhesive layer.

In an exemplary embodiment, a light emitting surface of the light emitting device may have optical micro-nano structures, or the light emitting surface of the light emitting apparatus may be provided with optical micro-nano structures.

In an exemplary embodiment, the optical micro-nano structure may include any one or more of micro cones, micro spheres, micro columns, and a micro grating.

In an exemplary embodiment, the micro cones may be distributed in an array.

In an exemplary embodiment, the micro spheres may be distributed in an array.

In an exemplary embodiment, the micro columns may be distributed in an array.

In an exemplary embodiment, the micro grating includes multiple protrusions that may be sequentially arranged in a second direction and extend in a third direction, the second direction intersecting the third direction.

In an exemplary embodiment, the micro cones may include any one or more of triangular micro cones and quadrangular micro cones.

In an exemplary embodiment, the micro columns may include any one or more of micro cylinders and micro square columns.

In an exemplary embodiment, a cross sectional shape of the protrusions of the micro grating may include any one or more of a triangle and a square.

In an exemplary embodiment, a feature size a of an optical micro-nano structure may be 2 nm to 800 nm, a period P may be 20 nm to 1000 nm, a duty cycle a/P may be 10% to 80%, and a height H may be 20 nm to 400 nm.

In an exemplary embodiment, a material of the current diffusion layers may be a material that is transparent and conductive and capable of forming ohmic contact with the P-type semiconductor layer of any one of the epitaxial structures or with the N-type semiconductor layer of any one of the epitaxial structures.

In an exemplary embodiment, a thickness of each current diffusion layer may be 50 nm to 250 nm.

In an exemplary embodiment, a thickness of the transparent adhesive layer may be substantially consistent with a diameter of the metal nanoparticles.

In an exemplary embodiment, the thickness of the transparent adhesive layer may be 5 nm to 100 nm.

In an exemplary embodiment, a material of the transparent adhesive layer may include any one or more of transparent optical acrylic adhesive, benzocyclobutene adhesive, epoxy resin and other optical adhesive materials.

In an exemplary embodiment, a number of the epitaxial structures may be 2 to 5.

In an exemplary embodiment, light emitted by the at least two epitaxial structures may be in a same waveband or may be in different wavebands.

In an exemplary embodiment, the at least two epitaxial structures include any one or more of an epitaxial structure capable of emitting red light, an epitaxial structure capable of emitting green light, and an epitaxial structure capable of emitting blue light.

In an exemplary embodiment, in the epitaxial structure capable of emitting red light, a material of the N-type semiconductor layer may include any one or more of N-type aluminum indium gallium phosphorus and gallium arsenide, and a thickness of the N-type semiconductor layer may be 0.5 μm to 3 μm; a material of the multi-quantum well layer may include any one or more of indium gallium nitrogen, gallium nitride and aluminum indium gallium phosphorus, and a thickness of the multi-quantum well layer may be 50 nm to 150 nm; a material of the P-type semiconductor layer may include any one or more of P-type aluminum indium gallium phosphorus and gallium arsenide, and a thickness of the P-type semiconductor layer may be 100 nm to 200 nm.

In an exemplary embodiment, in the epitaxial structure capable of emitting green light, a material of the N-type semiconductor layer may include N-type gallium nitride, and a thickness of the N-type semiconductor layer may be 0.5 μm to 3 μm; a material of the multi-quantum well layer may include any one or more of indium gallium nitrogen and gallium nitride, and a thickness of the multi-quantum well layer may be 50 nm to 150 nm; a material of the P-type semiconductor layer may include P-type gallium nitride, and a thickness of the P-type semiconductor layer may be 100 nm to 200 nm.

In an exemplary embodiment, in the epitaxial structure capable of emitting blue light, a material of the N-type semiconductor layer may include N-type gallium nitride, and a thickness of the N-type semiconductor layer may be 0.5 μm to 3 μm; a material of the multi-quantum well layer may include any one or more of indium gallium nitrogen and gallium nitride, and a thickness of the multi-quantum well layer may be 50 nm to 150 nm; a material of the P-type semiconductor layer may include P-type gallium nitride, and a thickness of the P-type semiconductor layer may be 100 nm to 200 nm.

In an exemplary embodiment, the light emitting device may further include a first electrode and a second electrode, wherein the first electrode is connected to an outermost P-type semiconductor layer of the at least two epitaxial structures, and the second electrode is connected to an outermost N-type semiconductor layer of the at least two epitaxial structures.

An embodiment of the present disclosure further provides a light emitting apparatus, including the light emitting device as described above.

Other aspects may be understood upon reading and understanding of the drawings and the detailed description.

BRIEF DESCRIPTION OF DRAWINGS

Accompanying drawings are used for providing understanding of technical solutions of the present disclosure, and form a part of the specification. They are used for explaining the technical solutions of the present disclosure together with the embodiments of the present disclosure, but do not form a limitation on the technical solutions of the present disclosure.

Meanings of reference signs in the accompanying drawings are as follows.

1—substrate; 2—sub-light emitting unit; 01—N-type semiconductor layer; 02—multi-quantum well layer; 03—P-type semiconductor layer; 3-P electrode sheet; 4-N electrode sheet; 10—first epitaxial structure; 10'—first epitaxial wafer; 11—first N-type semiconductor layer; 12—first multi-quantum well layer; 13—first P-type semiconductor layer; 20—second epitaxial structure; 20'—second epitaxial wafer; 21—second N-type semiconductor layer; 22—second multi-quantum well layer; 23—second P-type semiconductor layer; 30—third epitaxial structure; 31—third N-type semiconductor layer; 32—third multi-quantum well layer; 33—third P-type semiconductor layer; 41—first current diffusion layer; 42—second current diffusion layer; 43—third current diffusion layer; 44—fourth current diffusion layer; 51—first transparent adhesive layer; 52—second transparent adhesive layer; 60—metal nanoparticles; 60'-nano metal layer; 70-N electrode; 80-P electrode; 90—conductive layer; and 100—dielectric layer.

DETAILED DESCRIPTION

Implementations herein may be implemented in multiple different forms. Those of ordinary skills in the art can readily appreciate a fact that the implementations and contents may be varied into various forms without departing from the spirit and scope of the present disclosure. Therefore, the present disclosure should not be explained as being limited to contents described in following implementations only. The embodiments in the present disclosure and features in the embodiments may be combined randomly with each other if there is no conflict.

In the accompanying drawings, a size of a constituent element, and a thickness of a layer or a region is sometimes exaggerated for clarity. Therefore, any one implementation mode of the present disclosure is not necessarily limited to dimensions shown in the drawings, and the shapes and sizes of the components in the accompanying drawings do not reflect actual scales. In addition, the accompanying drawings schematically show an ideal example, and any one implementation mode of the present disclosure is not limited to the shapes, values, or the like shown in the accompanying drawings.

Figures 1, 2:
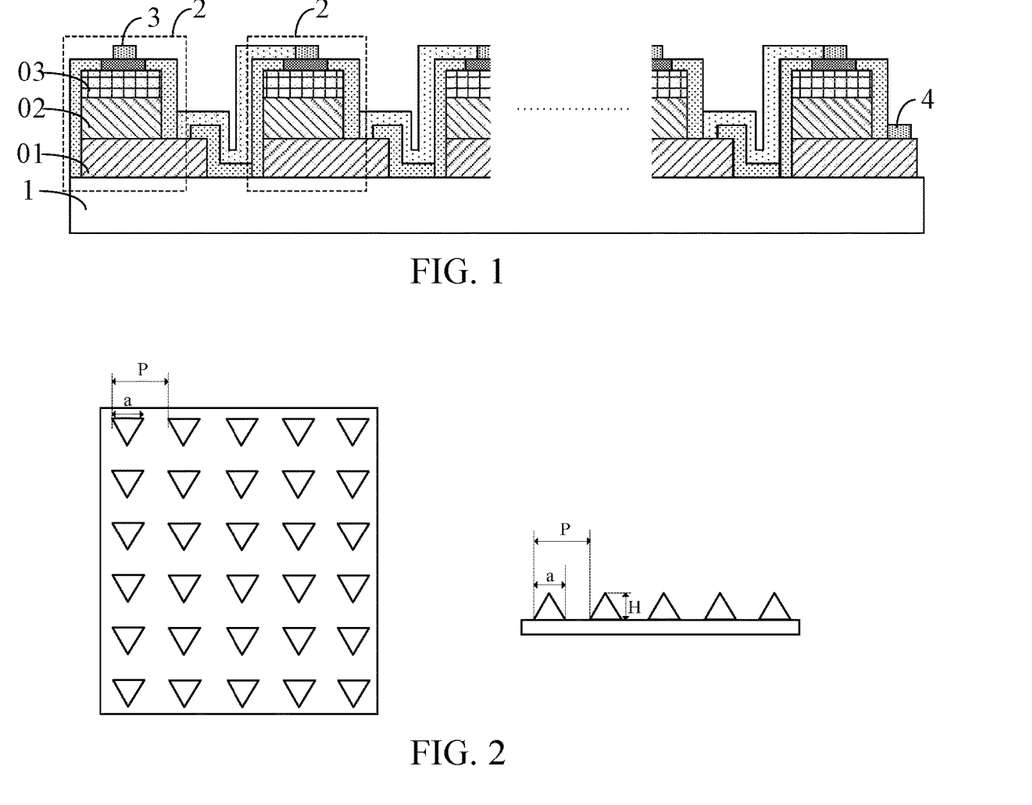
FIG. 1 is a schematic structural diagram of a light emitting device horizontally connected in series.
FIG. 2 is a top view and a partial front view of a light emitting device having or provided with triangular micro cones on a light emitting surface according to an exemplary embodiment of the present disclosure.

FIG. 1 is a schematic structural diagram of a light emitting device horizontally connected in series. As shown in FIG. 1, the light emitting device horizontally connected in series includes multiple sub-light emitting units 2 (including an N-type semiconductor layer 01, a multi-quantum well layer 02, and a P-type semiconductor layer 03), a P-electrode sheet 3, an N-electrode sheet 4, etc., which are disposed on a substrate 1 (e.g. a sapphire substrate). The multiple sub-light emitting units 2 are horizontally connected in series with each other, so a chip size thereof is usually to be large.

An embodiment of the present disclosure provides a light emitting device, including at least two epitaxial structures provided in a first direction and connected in series. Two current diffusion layers and a transparent adhesive layer are provided between two adjacent epitaxial structures. A current diffusion layer is provided at one side of each of the two adjacent epitaxial structures, the transparent adhesive layer is provided between the two current diffusion layers, and metal nanoparticles are provided in the transparent adhesive layer. Each epitaxial structure includes an N-type semiconductor layer, a multi-quantum well layer and a P-type semiconductor layer which are sequentially stacked along the first direction.

The N-type semiconductor layer (which may transport electrons, and therefore is also called electron transport layer), the multi-quantum well (MQW) layer and the P-type semiconductor layer (which may transport holes, and therefore is also called hole transport layer) may form PN junction, and the multi-quantum well layer may emit light upon application of a voltage.

According to the light emitting device provided by the embodiment of the present disclosure, by connecting at least two epitaxial structures in series along the first direction, the driving current may be reduced and the Joule heat may be reduced while achieving same light emitting brightness, and the light emitting device may be compatible with high-resolution display products without increasing an area of the light emitting device.

Therefore, the light emitting device according to the embodiment of the present disclosure meets the requirements of a high-voltage light emitting diode chip and may be used as the high-voltage light emitting diode chip.

The metal nanoparticles in the transparent adhesive layer may achieve good electrical connection with two adjacent current diffusion layers, and may improve light transmittance on a surface of the light emitting device.

In an exemplary embodiment, a material of the metal nanoparticles may include any one or more of nickel, silver, gold and the like.

In an exemplary embodiment, a diameter of the metal nanoparticles may be of a sub-wavelength scale. The metal nanoparticles with sub-wavelength scale may improve the light transmittance of the transparent adhesive layer and a light extraction efficiency of the light emitting device.

In an exemplary embodiment, the diameter of the metal nanoparticles may be 5 nm to 100 nm.

In an exemplary embodiment, the metal nanoparticles may be distributed as a single layer of particles in the transparent adhesive layer.

In an exemplary embodiment, a total volume of the metal nanoparticles may be 10% to 60% of a volume of the transparent adhesive layer.

In an exemplary embodiment, a light emitting surface of the light emitting device may have optical micro-nano structures, or the light emitting surface of the light emitting apparatus may be provided with optical micro-nano structures.

Here, the light emitting surface having the optical micro-nano structures means that the light emitting surface itself is provided as the optical micro-nano structures. The light emitting surface being provided with the optical micro-nano structures means that the optical micro-nano structures are provided individually on one side of the light emitting surface, and the optical micro-nano structures may be directly provided on one side of the light emitting surface, or a dielectric layer of the optical micro-nano structures may be provided on one side of the light emitting surface first, and then the optical micro-nano structures are provided on a side of the dielectric layer away from the light emitting surface. A material of the individually provided optical micro-nano structures may include any one or more of metal, silicon oxide and silicon nitride. A material of the dielectric layer may include any one or more of metal, silicon oxide, and silicon nitride.

The multiple epitaxial structures connected in series in the first direction have a unified light emitting surface, and better light emitting effect may be realized by providing the light emitting surface as the optical micro-nano structures or providing the optical micro-nano structures on the light emitting surface.

In an exemplary embodiment, the optical micro-nano structures may include any one or more of micro cones, micro spheres, micro columns, and micro grating.

In an exemplary embodiment, the micro cones may be distributed in an array.

In an exemplary embodiment, the micro spheres may be distributed in an array.

In an exemplary embodiment, the micro columns may be distributed in an array.

In an exemplary embodiment, the micro grating includes multiple protrusions that may be sequentially arranged in a second direction and extend in a third direction, wherein the second direction intersects the third direction.

In an exemplary embodiment, the micro cones may include any one or more of triangular micro cones and quadrangular micro cones.

In an exemplary embodiment, the micro columns may include any one or more of micro cylinders and micro square columns.

In an exemplary embodiment, a cross sectional shape of a protrusion of the micro grating may include any one or more of a triangle and a square.

Figure 3:
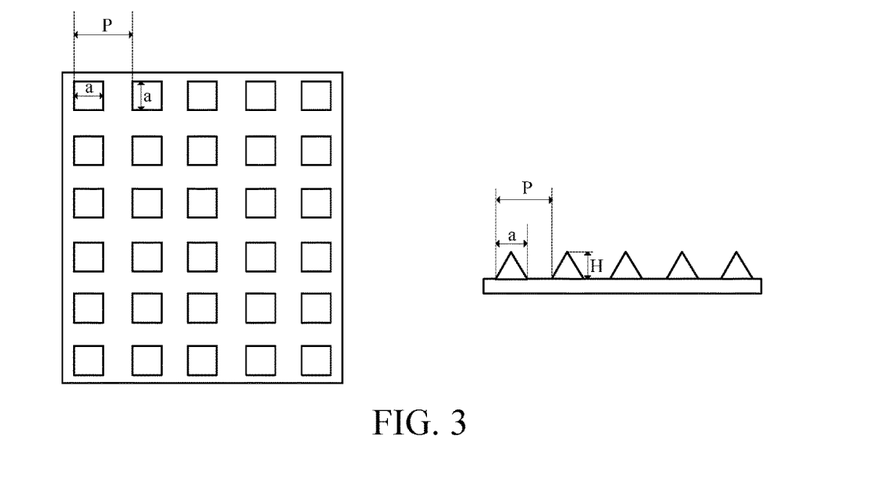
FIG. 3 is a top view and a partial front view of a light emitting device having or provided with a quadrangular micro cones on a light emitting surface according to an exemplary embodiment of the present disclosure.
Figure 4:
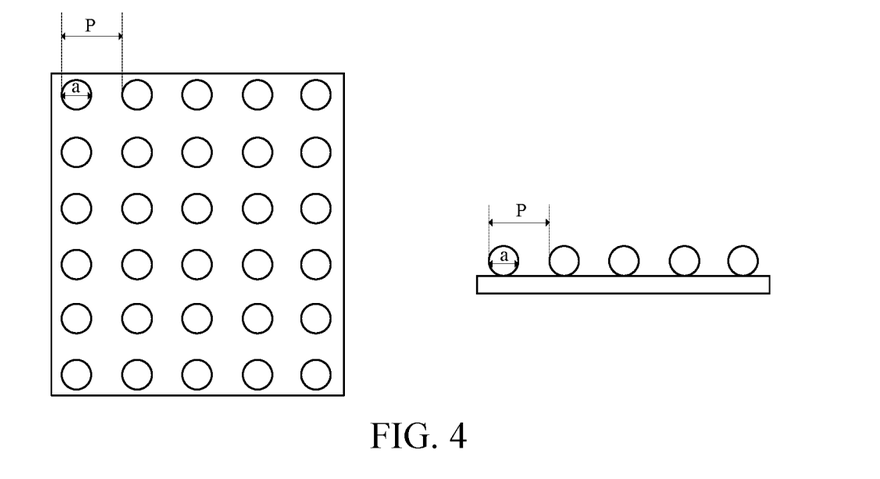
FIG. 4 is a top view and a partial front view of a light emitting device having or provided with micro spheres on a light emitting surface according to an exemplary embodiment of the present disclosure.
Figure 5:
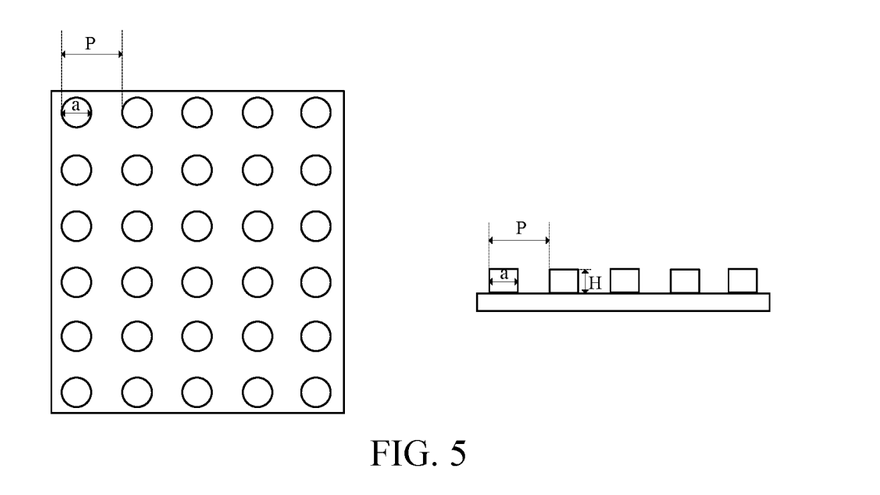
FIG. 5 is a top view and a partial front view of a light emitting device having or provided with micro cylinders on a light emitting surface according to an exemplary embodiment of the present disclosure.
Figure 6:
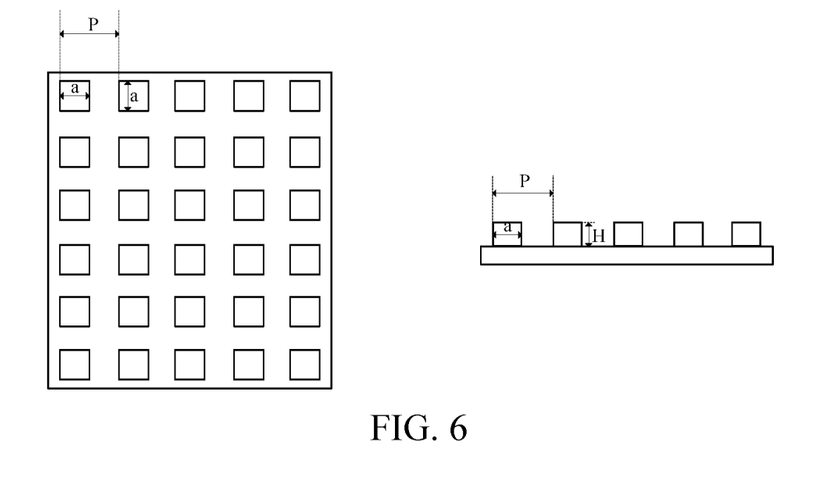
FIG. 6 is a top view and a partial front view of a light emitting device having or provided with micro square columns on a light emitting surface according to an exemplary embodiment of the present disclosure.
Figure 7:
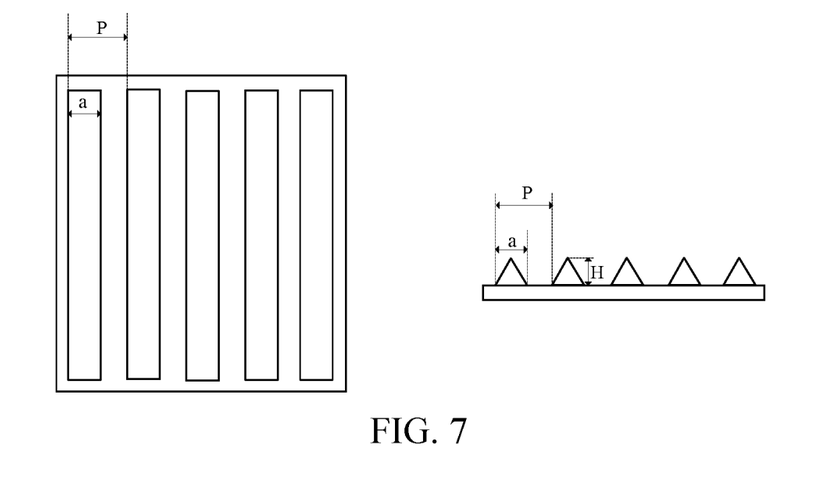
FIG. 7 is a top view and a partial front view of a light emitting device having or provided with a micro grating whose protrusions' cross sections are triangular on a light emitting surface according to an exemplary embodiment of the present disclosure.
Figure 8:
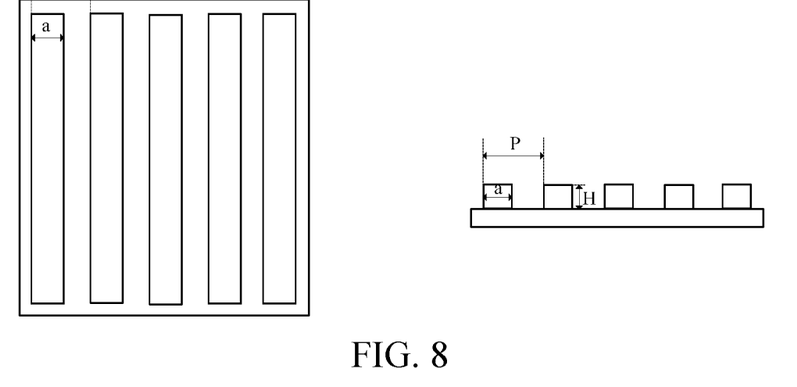
FIG. 8 is a top view and a partial front view of a light emitting device having or provided with a micro grating whose protrusions' cross sections are square on a light emitting surface according to an exemplary embodiment of the present disclosure.

FIG. 2 is a top view and a partial front view of a light emitting device having or provided with triangular micro cones on a light emitting surface according to an exemplary embodiment of the present disclosure. FIG. 3 is a top view and a partial front view of a light emitting device having or provided with quadrangular micro cones on a light emitting surface according to an exemplary embodiment of the present disclosure. FIG. 4 is a top view and a partial front view of a light emitting device having or provided with micro spheres on a light emitting surface according to an exemplary embodiment of the present disclosure. FIG. 5 is a top view and a partial front view of a light emitting device having or provided with micro cylinders on a light emitting surface according to an exemplary embodiment of the present disclosure. FIG. 6 is a top view and a partial front view of a light emitting device having or provided with micro square columns on a light emitting surface according to an exemplary embodiment of the present disclosure. FIG. 7 is a top view and a partial front view of a light emitting device having or provided with a micro grating whose protrusions' cross sections are triangular on a light emitting surface according to an exemplary embodiment of the present disclosure. FIG. 8 is a top view and a partial front view of a light emitting device having or provided with a micro grating whose protrusions' cross sections are square on a light emitting surface according to an exemplary embodiment of the present disclosure. Among them, drawings on the left are top views, and drawings on the right are partial front views. In the drawings, a represents a feature size of an optical micro-nano structure, P represents a period of the optical micro-nano structures, and H represents a height of an optical micro-nano structure.

In an exemplary embodiment, the feature size a of the optical micro-nano structure may be 2 nm to 800 nm, the period P may be 20 nm to 1000 nm, a duty cycle a/P may be 10% to 80%, and the height H may be 20 nm to 400 nm.

In an exemplary embodiment, a material of the current diffusion layer may be a transparent conductive material capable of forming ohmic contact with the P-type semiconductor layer or with the N-type semiconductor layer of any one epitaxial structure, for example, the material of the current diffusion layer may include any one or more of Indium Tin Oxide (ITO), Indium Zinc Oxide, Nickel, Chromium and the like. The current diffusion layer, also called current spreading layer, may increase uniformity of spreading of the chip's current, and may be used as an ohmic contact layer between the P-type semiconductor layer and a Distributed Bragg Reflector (DBR) reflective layer.

In an exemplary embodiment, a thickness of the current diffusion layer may be 50 nm to 250 nm.

In an exemplary embodiment, a thickness of the transparent adhesive layer may be substantially consistent with the diameter of the metal nanoparticles.

In an exemplary embodiment, the thickness of the transparent adhesive layer may be 5 nm to 100 nm.

In an exemplary embodiment, a material of the transparent adhesive layer may include any one or more of transparent optical acrylic adhesive, benzocyclobutene adhesive, epoxy resin and other optical adhesive materials.

In an exemplary embodiment, a number of the epitaxial structures may be 2 to 5, for example, it may be 2, 3, 4 or 5.

In an exemplary embodiment, the epitaxial structure may respectively include an N-type semiconductor layer, a multi-quantum well layer, and a P-type semiconductor layer that are sequentially stacked in a first direction.

In an exemplary embodiment, light emitted by the at least two epitaxial structures may be in a same waveband or may be in different wavebands.

In an exemplary embodiment, the at least two epitaxial structures include any one or more of an epitaxial structure capable of emitting red light, an epitaxial structure capable of emitting green light, and an epitaxial structure capable of emitting blue light.

In an exemplary embodiment, in the epitaxial structure capable of emitting red light, a material of the N-type semiconductor layer may include any one or more of N-type aluminum indium gallium phosphorus and gallium arsenide, and a thickness of the N-type semiconductor layer may be 0.5 μm to 3 μm. A material of the multi-quantum well layer may include any one or more of indium gallium nitrogen, gallium nitride and aluminum indium gallium phosphorus with different components, and a thickness of the multi-quantum well layer may be 50 nm to 150 nm. A material of the P-type semiconductor layer may include any one or more of P-type aluminum indium gallium phosphorus and gallium arsenide, and a thickness of the P-type semiconductor layer may be 100 nm to 200 nm.

In an exemplary embodiment, in the epitaxial structure capable of emitting green light, a material of the N-type semiconductor layer may include N-type gallium nitride, and a thickness of the N-type semiconductor layer may be 0.5 μm to 3 μm. A material of the multi-quantum well layer may include any one or more of indium gallium nitrogen and gallium nitride with different components, and a thickness of the multi-quantum well layer may be 50 nm to 150 nm. A material of the P-type semiconductor layer may include P-type gallium nitride, and a thickness of the P-type semiconductor layer may be 100 nm to 200 nm.

In an exemplary embodiment, in the epitaxial structure capable of emitting blue light, a material of the N-type semiconductor layer may include N-type gallium nitride, and a thickness of the N-type semiconductor layer may be 0.5 μm to 3 μm. A material of the multi-quantum well layer may include any one or more of indium gallium nitrogen and gallium nitride with different components, and a thickness of the multi-quantum well layer may be 50 nm to 150 nm. A material of the P-type semiconductor layer may include P-type gallium nitride, and a thickness of the P-type semiconductor layer may be 100 nm to 200 nm.

In an exemplary embodiment, the light emitting device may further include a first electrode and a second electrode, wherein the first electrode is connected to an outermost P-type semiconductor layer of the at least two epitaxial structures, and the second electrode is connected to an outermost N-type semiconductor layer of the at least two epitaxial structures.

In an exemplary embodiment, the light emitting device may have a length of 5 μm to 500 μm and a width of 5 μm to 500 μm.

In an exemplary embodiment, the light emitting device may have a flip-chip structure.

Figure 9:
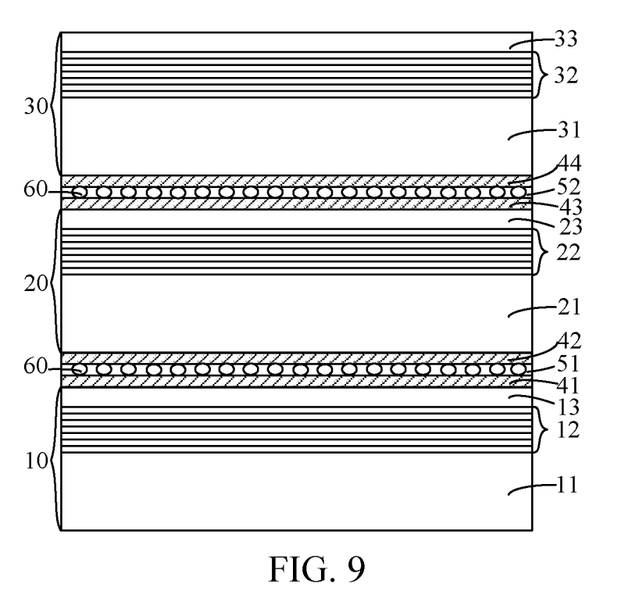
FIG. 9 is a first schematic structural diagram of a light emitting device according to an exemplary embodiment of the present disclosure.

FIG. 9 is a first schematic structural diagram of a light emitting device according to an exemplary embodiment of the present disclosure. In this exemplary embodiment, as shown in FIG. 9, the light emitting device includes three epitaxial structures, i.e., a first epitaxial structure 10, a second epitaxial structure 20, and a third epitaxial structure 30 respectively. The first epitaxial structure 10, the second epitaxial structure 20, and the third epitaxial structure 30 are stacked in a first direction (e.g., may be the up-down direction shown in FIG. 9) and connected together in series. The first epitaxial structure 10 includes a first N-type semiconductor layer 11, a first multi-quantum well layer 12, and a first P-type semiconductor layer 13. The second epitaxial structure 20 includes a second N-type semiconductor layer 21, a second multi-quantum well layer 22, and a second P-type semiconductor layer 23. The third epitaxial structure 30 includes a third N-type semiconductor layer 31, a third multi-quantum well layer 32, and a third P-type semiconductor layer 33. A first current diffusion layer 41, a first transparent adhesive layer 51 and a second current diffusion layer 42 are provided between the first epitaxial structure 10 and the second epitaxial structure 20. A third current diffusion layer 43, a second transparent adhesive layer 52 and a fourth current diffusion layer 44 are provided between the second epitaxial structure 20 and the third epitaxial structure 30. Metal nanoparticles 60 are provided in both the first transparent adhesive layer 51 and the second transparent adhesive layer 52.

The first multi-quantum well layer 12 is provided on one side of the first N-type semiconductor layer 11. The first P-type semiconductor layer 13 is provided on a side of the first multi-quantum well layer 12 away from the first N-type semiconductor layer 11. The first current diffusion layer 41 is provided on a side of the first P-type semiconductor layer 13 away from the first N-type semiconductor layer 11. The first transparent adhesive layer 51 is provided on a side of the first current diffusion layer 41 away from the first N-type semiconductor layer 11. The second current diffusion layer 42 is provided on a side of the first transparent adhesive layer 51 away from the first N-type semiconductor layer 11.

The second N-type semiconductor layer 21 is provided on a side of the second current diffusion layer 42 away from the first N-type semiconductor layer 11. The second multi-quantum well layer 22 is provided on a side of the second N-type semiconductor layer 21 away from the first N-type semiconductor layer 11. The second P-type semiconductor layer 23 is provided on a side of the second multi-quantum well layer 22 away from the first N-type semiconductor layer 11. The third current diffusion layer 43 is provided on a side of the second P-type semiconductor layer 23 away from the first N-type semiconductor layer 11. The second transparent adhesive layer 52 is provided on a side of the third current diffusion layer 43 away from the first N-type semiconductor layer 11. The fourth current diffusion layer 44 is provided on a side of the second transparent adhesive layer 52 away from the first N-type semiconductor layer 11. The third N-type semiconductor layer 31 is provided on a side of the fourth current diffusion layer 44 away from the first N-type semiconductor layer 11. The third multi-quantum well layer 32 is provided on a side of the third N-type semiconductor layer 31 away from the first N-type semiconductor layer 11. The third P-type semiconductor layer 33 is provided on a side of the third multi-quantum well layer 32 away from the first N-type semiconductor layer 11.

In an exemplary embodiment, the light emitting device may further include a first electrode and a second electrode, wherein the first electrode is connected to an outermost P-type semiconductor layer of the at least two epitaxial structures, and the second electrode is connected to an outermost N-type semiconductor layer of the at least two epitaxial structures.

In an exemplary embodiment, the light emitting device may further include a first electrode and a second electrode. The light emitting device may have a vertical LED chip structure. In this case, the first electrode is a reflective electrode, the at least two epitaxial structures are provided on one side of the reflective electrode in a vertically stacked manner according to the order of the first epitaxial structure, the second epitaxial structure . . . to the N-th epitaxial structure. The N-type semiconductor layer of the first epitaxial structure is provided on one side of the reflective electrode, and the second electrode is provided on one side of the P-type semiconductor layer of the N-th epitaxial structure. The second electrode may have an optical micro-nano structure.

Figure 10:
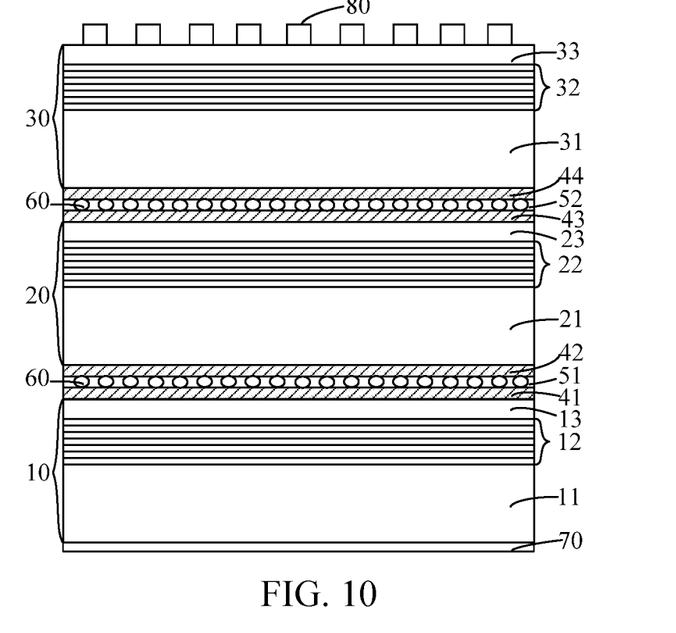
FIG. 10 is a second schematic structural diagram of a light emitting device according to an exemplary embodiment of the present disclosure.

FIG. 10 is a second schematic structural diagram of a light emitting device according to an exemplary embodiment of the present disclosure. As shown in FIG. 10, the first electrode 70 uses a metal having a high reflectivity as the reflective electrode and the second electrode 80 may have a metal wire grid structure so as to realize linearly polarized light emission.

Figure 11:
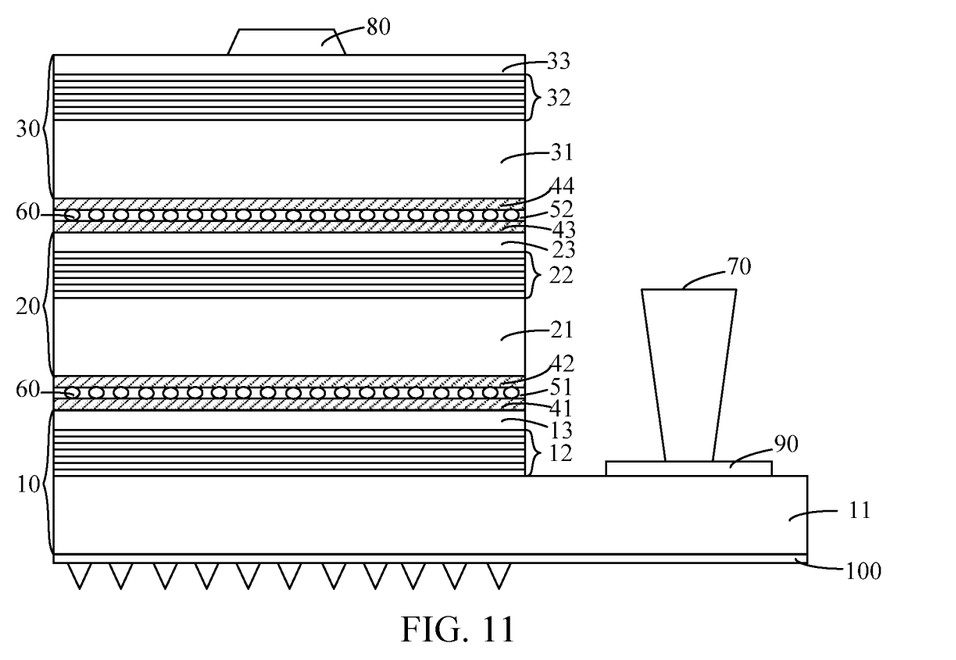
FIG. 11 is a third schematic structural diagram of a light emitting device according to an exemplary embodiment of the present disclosure.

FIG. 11 is a third schematic structural diagram of a light emitting device according to an exemplary embodiment of the present disclosure. As shown in FIG. 11, in an exemplary embodiment, the light emitting device may further include a first electrode and a second electrode. The first electrode is an N electrode 70, and the second electrode is a P electrode 80. The P electrode 80 is provided on one side of the at least two epitaxial structures. The at least two epitaxial structures are sequentially a first epitaxial structure 10, a second epitaxial structure 20, a third epitaxial structure 30 to an N-th epitaxial structure in a direction close to the P electrode. The P electrode 80 is provided on one side of the P-type semiconductor layer 33 of the N-th epitaxial structure. The N electrode 70 is provided on one side of the first N-type semiconductor layer 11 of the first epitaxial structure 10 close to the P electrode 80 and extends over the first N-type semiconductor layer 11 of the first epitaxial structure 10 through a conductive layer 90 (e.g., a metal conductive layer). The N electrode 70 is spaced from sidewalls of the multi-quantum well layer 12 and the first P-type semiconductor layer 13 of the first epitaxial structure 10, and the side of the first N-type semiconductor layer 11 of the first epitaxial structure 10 away from the P electrode 80 may have or be provided with the optical micro-nano structure.

In an exemplary embodiment, the side of the first N-type semiconductor layer 11 of the first epitaxial structure 10 away from the P electrode 80 may be provided with a micro cone structure, which may improve the light emitting efficiency of the light emitting device. As shown in FIG. 11, the micro cone structure may be indirectly provided on the side of the first N-type semiconductor layer 11 away from the P electrode 80 through a dielectric layer 100, that is, the dielectric layer 100 is provided on the side of the first N-type semiconductor layer 11 away from the P electrode 80, and the micro cone structure is provided on a side of the dielectric layer 100 away from the P electrode 80. In other embodiments, the dielectric layer 100 may not be provided and the optical micro-nano structure may be directly provided on the side of the first N-type semiconductor layer 11 away from the P electrode 80.

In an exemplary embodiment, the light emitting device further includes a substrate on which at least two epitaxial structures are provided. The substrate may be Sapphire. The substrate of blue light chips and green light chips is made of sapphire. In a red light chip, the substrate is made of GaAs, which is then bonded to sapphire substrate and the GaAs peeled off.

In an exemplary embodiment, the substrate may be a patterned sapphire substrate (PSS). Direct formation of an N-type semiconductor material or P-type semiconductor material on the sapphire substrate causes large dislocation density, which leads to low internal quantum efficiency of the light-emitting device. By forming micro periodic patterns on a surface of the sapphire substrate, dislocation density may be reduced and photon escape probability in active region may be improved.

In an exemplary embodiment, the light emitting device may further include a buffer Layer. The buffer layer may be provided between the substrate and an epitaxial structure, and may be made of GaN and AlN materials, thereby providing a nucleation center for the growth of the N-type semiconductor material or P-type semiconductor material, promoting the three-dimensional island growth of the N-type semiconductor material or P-type semiconductor material to become two-dimensional lateral growth, and reducing dislocation density.

In an exemplary embodiment, the light emitting device may further include a current blocking layer (CBL). The current blocking layer may prevent current crowding at the P-type electrode and further improve the current spreading performance.

In an exemplary embodiment, the light emitting device may further include a distributed bragg reflector (DBR). Bragg reflector is a periodic thin film structure composed of two kinds of high and low refractive index materials alternately arranged, which may change the energy gap position by adjusting refractive index and thickness of the materials, and may adapt to different wavelengths. The Bragg reflector may be provided on a side of a current diffusion layer farthest from the substrate away from the substrate.

Figure 12:
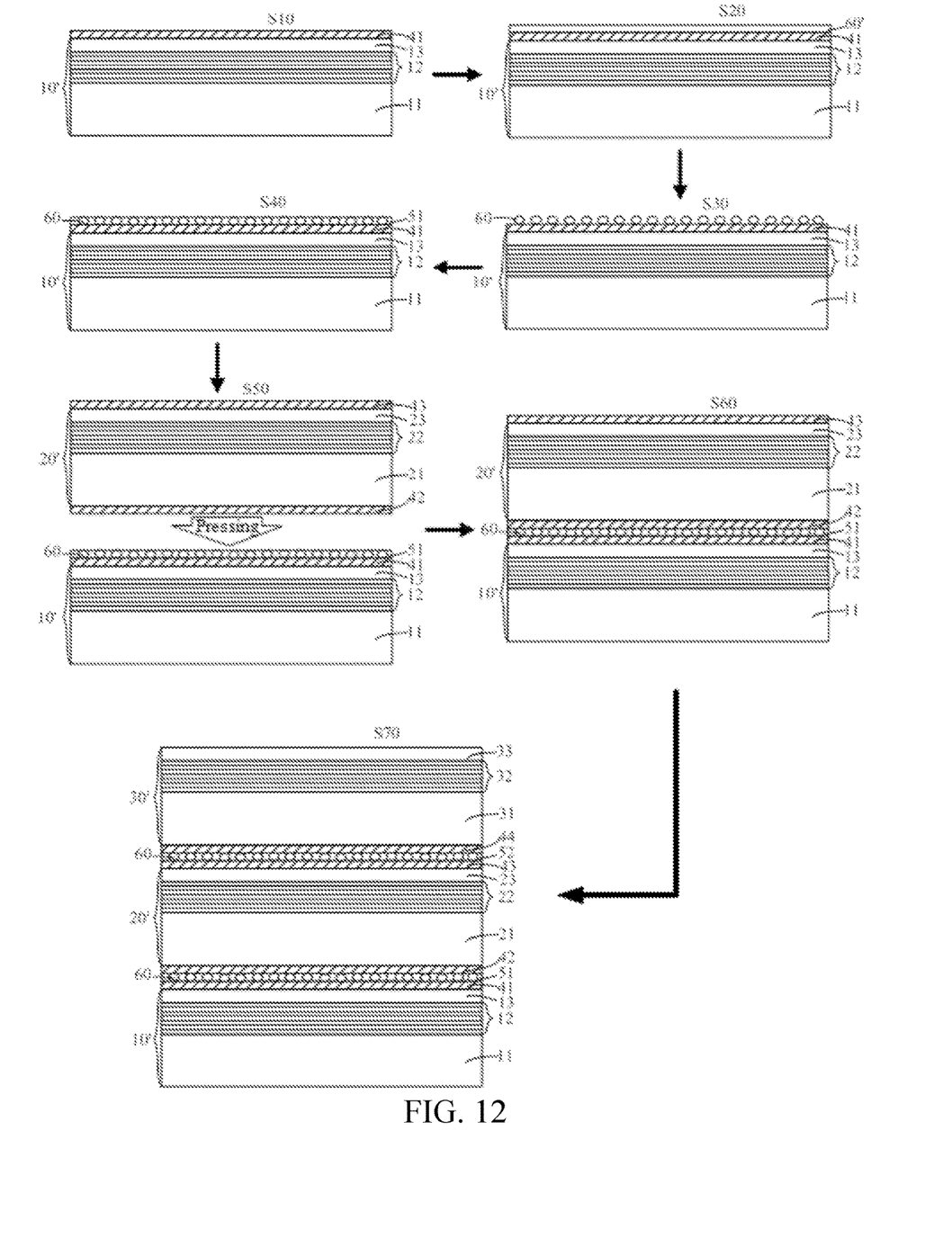
FIG. 12 is a flow chart of a manufacturing process of a light emitting device according to an exemplary embodiment of the present disclosure.

An embodiment of the present disclosure further provides a method for manufacturing the light emitting device as described above. FIG. 12 is a flow chart of a manufacturing process of a light emitting device according to an exemplary embodiment of the present disclosure. As shown in FIG. 12, the manufacturing method includes the following steps:

S10: providing an epitaxial wafer, and providing a current diffusion layer on a P-type semiconductor layer of the epitaxial wafer;

S20: taking a first epitaxial wafer 10' on which a first current diffusion layer 41 is provided at one side of the first P-type semiconductor layer 13, and providing a nano metal layer 60' on the first current diffusion layer 41;

S30: self-growing a metal of the nano metal layer 60' to form metal nanoparticles 60 by an annealing process;

S40: coating a transparent adhesive material on surfaces of the metal nanoparticles 60 so that the transparent adhesive material completely wraps the metal nanoparticles to obtain a first transparent adhesive layer 51;

S50: performing high-voltage bonding and curing on a second epitaxial wafer 20' which has been peeled off from the substrate and is provided with a second current diffusion layer 42 on one side of the second N-type semiconductor layer 21, and the epitaxial wafer provided with the first transparent adhesive layer 51 obtained in step S40; and S60: contacting the metal nanoparticles 60 with the second current diffusion layer 42 to achieve electrical connection to obtain a light emitting device including two epitaxial structures.

In an exemplary embodiment, the manufacturing method further includes the following step:

S70: referring to steps S20 to S60, continuously introducing the third epitaxial wafer 30' to the N-th epitaxial wafer so as to obtain the light emitting device including N epitaxial structures as in step S60.

In an exemplary embodiment, process conditions of the annealing process in step S30 may include: an annealing temperature may be 400° C. to 1200° C., for example, 400° C., 500° C., 600° C., 700° C., 800° C., 900° C., 1000° C., 1100° C., or 1200° C.; and annealing time may be 1 min to 5 min, for example, 1 min, 2 min, 3 min, 4 min, or 5 min.

In an exemplary embodiment, a pressure required for the bonding in step S30 may be from 0 to 2 MPa, for example, 0 MPa, 0.5 MPa, 1 MPa, 1.5 MPa, or 2 MPa.

In an exemplary embodiment, a curing temperature in step S30 may be from 150° C. to 350° C., for example, 150° C., 200° C., 250° C., 300° C., or 350° C., and curing time may be from 0 to 1.5 h, for example, 0 h, 0.5 h, 0.75 h, 1 h, 1.25 h, or 1.5 h.

The metal nanoparticles in the transparent adhesive layer may realize good electrical connection with two adjacent current diffusion layers, may improve the light transmittance on the surface of the light emitting device, and may enhance an internal quantum efficiency of the light emitting device when the P-type semiconductor layer is thin. In an exemplary embodiment, the nano metal layer may be formed by deposition.

In an exemplary embodiment, the current diffusion layer may be formed by deposition.

In an exemplary embodiment, a thickness of the transparent adhesive material coated in step S40 may be greater than a diameter of the metal nanoparticles, but the thickness of the transparent adhesive layer formed after bonding and curing is substantially consistent with the diameter of the metal nanoparticles.

In an exemplary embodiment, the manufacturing method may further include the step of providing the light emitting surface of the light emitting device as an optical micro-nano structure or providing an optical micro-nano structure on the light emitting surface of the light emitting device.

In an exemplary embodiment, the epitaxial wafer may be a Light Emitting Diode (LED) epitaxial wafer.

An embodiment of the present disclosure further provides a light emitting apparatus, including the light emitting device as described above.

The light emitting apparatus may be any product or part with a display function, such as a mobile phone, a tablet computer, a television, a display, a laptop computer, a digital photo frame, a navigator, a vehicle-mounted display, a smart watch, and a smart bracelet.

Although the embodiments disclosed in the present disclosure are as above, the described contents are only embodiments used for convenience of understanding the present disclosure and are not intended to limit the present disclosure. Any person skilled in the art of the present disclosure may make any modification and change in forms and details of implementation without departing from the spirit and scope disclosed in the present disclosure. However, the scope of patent protection of the present disclosure is still subject to the scope defined in the appended claims.

The invention claimed is:

1. A light emitting device, comprising at least two epitaxial structures provided in a first direction and connected in series, wherein two current diffusion layers and a transparent adhesive layer are provided between two adjacent epitaxial structures, a current diffusion layer is provided at one side of each of the two adjacent epitaxial structures, the transparent adhesive layer is provided between the two current diffusion layers, and metal nanoparticles are provided in the transparent adhesive layer, wherein each epitaxial structure comprises an N-type semiconductor layer, a multi-quantum well layer and a P-type semiconductor layer which are sequentially stacked along the first direction.

2. The light emitting device according to claim 1, wherein a material of the metal nanoparticles comprises any one or more of nickel, silver, and gold.

3. The light emitting device according to claim 1, wherein a diameter of the metal nanoparticles is 5 nm to 100 nm.

4. The light emitting device according to claim 1, wherein the metal nanoparticles are distributed as a single layer of particles in the transparent adhesive layer.

5. The light emitting device according to claim 1, wherein a total volume of the metal nanoparticles is 10% to 60% of a volume of the transparent adhesive layer.

6. The light emitting device according to claim 1, wherein a light emitting surface of the light emitting device has optical micro-nano structures or is provided with optical micro-nano structures.

7. The light emitting device according to claim 6, wherein the optical micro-nano structure comprises any one or more of micro cones, micro spheres, micro columns, and micro grating.

8. The organic light emitting device according to claim 7, wherein
the micro cones are distributed in an array; and/or
the micro spheres are distributed in an array; and/or
the micro columns are distributed in an array; and/or
the micro grating comprises a plurality of protrusions arranged sequentially in a second direction and extending in a third direction, the second direction intersecting the third direction.

9. The light emitting device according to claim 7, wherein the micro cones comprise any one or more of triangular micro cones and quadrangular micro cones; and/or the micro columns comprise any one or more of micro cylinders and micro square columns; and/or a cross sectional shape of the protrusions of the micro grating comprises any one or more of a triangle and a square.

10. The light emitting device according to claim 6, wherein an optical micro-nano structure has a feature size a of 2 nm to 800 nm, a period P of 20 nm to 1000 nm, a duty cycle a/P of 10% to 80%, and a height H of 20 nm to 400 nm.

11. The light emitting device according to claim 1, wherein a material of the current diffusion layers is transparent and conductive and capable of forming ohmic contact with the P-type semiconductor layer of any one of the epitaxial structures or with the N-type semiconductor layer of any one of the epitaxial structures.

12. The light emitting device according to claim 1, wherein a thickness of a current diffusion layer is 50 nm to 250 nm.

13. The light emitting device according to claim 1, wherein a thickness of the transparent adhesive layer is substantially consistent with a diameter of the metal nanoparticles.

14. The light emitting device according to claim 13, wherein the thickness of the transparent adhesive layer is 5 nm to 100 nm.

15. The light emitting device according to claim 1, wherein a material of the transparent adhesive layer comprises any one or more of a transparent optical acrylic adhesive, a benzocyclobutene adhesive material and an epoxy resin.

16. The light emitting device according to claim 1, wherein a number of the epitaxial structures is 2 to 5.

17. The light emitting device according to claim 1, wherein light emitted by the at least two epitaxial structures is in a same waveband or in different wavebands.

18. The light emitting device according to claim 17, wherein the at least two epitaxial structures comprise any one or more of an epitaxial structure capable of emitting red light, an epitaxial structure capable of emitting green light, and an epitaxial structure capable of emitting blue light;

in the epitaxial structure capable of emitting red light, a material of the N-type semiconductor layer comprises any one or more of N-type aluminum indium gallium phosphorus and gallium arsenide, and a thickness of the N-type semiconductor layer is 0.5 μm to 3 μm; a material of the multi-quantum well layer comprises any one or more of indium gallium nitrogen, gallium nitride and aluminum indium gallium phosphorus, and a thickness of the multi-quantum well layer is 50 nm to 150 nm; a material of the P-type semiconductor layer comprises any one or more of P-type aluminum indium gallium phosphorus and gallium arsenide, and a thickness of the P-type semiconductor layer is 100 nm to 200 nm; or in the epitaxial structure capable of emitting green light, a material of the N-type semiconductor layer comprises N-type gallium nitride, and a thickness of the N-type semiconductor layer is 0.5 μm to 3 μm; a material of the multi-quantum well layer comprises any one or more of indium gallium nitrogen and gallium nitride, and a thickness of the multi-quantum well layer is 50 nm to 150 nm; a material of the P-type semiconductor layer comprises P-type gallium nitride, and a thickness of the P-type semiconductor layer is 100 nm to 200 nm; or in the epitaxial structure capable of emitting blue light, a material of the N-type semiconductor layer comprises N-type gallium nitride, and a thickness of the N-type semiconductor layer is 0.5 μm to 3 μm; a material of the multi-quantum well layer comprises any one or more of indium gallium nitrogen and gallium nitride, and a thickness of the multi-quantum well layer is 50 nm to 150 nm; a material of the P-type semiconductor layer comprises P-type gallium nitride, and a thickness of the P-type semiconductor layer is 100 nm to 200 nm.

19. The light emitting device according to claim 1, further comprising a first electrode and a second electrode; wherein the first electrode is connected to an outermost P-type semiconductor layer of the at least two epitaxial structures, and the second electrode is connected to an outermost N-type semiconductor layer of the at least two epitaxial structures.

20. A light emitting apparatus, comprising the light emitting device according to claim 1.

* * * * *